(12) United States Patent
Döllgast et al.

(10) Patent No.: US 7,750,539 B2
(45) Date of Patent: Jul. 6, 2010

(54) RECEPTION BUSH FOR A PIEZOACTUATOR

(75) Inventors: Bernd Döllgast, Erlangen (DE); Horst Gilg, Maxhütte (DE); Jörg Haubold, Limbach-Oberfrohna (DE); Emanuel Sanftleben, Pfatter (DE); Carsten Schuh, Baldham (DE); Marcus Unruh, Zeitlarn (DE); Claus Zumstrull, Regenstauf (DE)

(73) Assignee: Continental Automotive GmbH, Hannover (DE)

( * ) Notice: Subject to any disclaimer, the term of this patent is extended or adjusted under 35 U.S.C. 154(b) by 811 days.

(21) Appl. No.: 10/595,387

(22) PCT Filed: Oct. 14, 2004

(86) PCT No.: PCT/EP2004/052540

§ 371 (c)(1),
(2), (4) Date: Feb. 16, 2007

(87) PCT Pub. No.: WO2005/038940

PCT Pub. Date: Apr. 28, 2005

(65) Prior Publication Data

US 2007/0120443 A1    May 31, 2007

(30) Foreign Application Priority Data

Oct. 14, 2003  (DE) .................. 103 47 768

(51) Int. Cl.
*H01L 41/08* (2006.01)
(52) U.S. Cl. ..................................... 310/348; 310/344
(58) Field of Classification Search ................ 310/311, 310/344, 348
See application file for complete search history.

(56) References Cited

U.S. PATENT DOCUMENTS 5,004,945 A    4/1991    Tomita et al. ............... 310/328

FOREIGN PATENT DOCUMENTS

| DE | 19715487 | 10/1998 |
| WO | 2004047191 | 6/2004 |

OTHER PUBLICATIONS

PCT International Preliminary Report w/Written Opinion, PCT/EP2004/052540, 12 pgs.

*Primary Examiner*—Mark Budd
(74) *Attorney, Agent, or Firm*—King & Spalding L.L.P.

(57) ABSTRACT

A reception bush for a piezoelectric actuator is provided with two connection pins for electrically bonding the piezoelectric actuator, in particular for a piezoelectric actuator controlling the injector of an injection system for an internal combustion engine. The reception bush has a first (1) and a second (2) bush elements which are interconnected when the bush is mounted. The first element (1) is provided with through holes (4, 5) for the connection pins of the inventive piezoelectric actuator. The second element (2) is provided with at least one guide (12) for the connection pins.

23 Claims, 2 Drawing Sheets

RECEPTION BUSH FOR A PIEZOACTUATOR

CROSS-REFERENCE TO RELATED APPLICATIONS

This application is a U.S. national stage application of International Application No. PCT/EP2004/052540 filed Oct. 14, 2004, which designates the United States of America, and claims priority to German application number DE 103 47 768.3 filed Oct. 14, 2003, the contents of which are hereby incorporated by reference in their entirety.

TECHNICAL FIELD

The invention relates to a reception bush for a piezoactuator, especially for a piezoactuator for driving an injector of an Injection system for an internal combustion engine.

BACKGROUND

Piezoactuators are increasingly used to drive the injectors in modern injection systems for internal combustion engines. When these types of piezoactuators are installed a piezoceramic stack is usually fitted into a cylindrical reception bush consisting of two cylindrical bush elements.

In this case cutouts are arranged in the end faces of the two cylindrical bush elements, through which the piezoceramic stack protrudes outwards, with the reception bush being somewhat shorter than the piezoceramic stack, so that the interference fit is made using only the end faces of the piezoceramic stack.

In addition two through-holes are arranged in the end face of a bush element, through which the two connection pins which are used for electrical contacting of the piezoactuator can protrude.

When these known reception bushes are fitted together the piezoceramic stack is first inserted into one of the two bush elements so that the cutout in the bush element accepts the piezoceramic stack. Subsequently the second bush element is then fitted and pushed onto the other bush element until the two elements are joined to each other by a snap-on connection. For this installation it is necessary to ensure that the two bush elements retain a predetermined angular position relative to each other, so that the cutouts in the end faces of the two bush elements cover each other so that these accept the piezoceramic stack. The correct angular position of the two bush elements relative to one another is also important so that the connection pins for the piezoceramic stack can protrude outwards through the through holes. Subsequently the known reception bush is filled with a sealant (e.g. Silicon) which fixes the piezoceramic stack and the connection pins.

SUMMARY

The disadvantage of the known reception bush for a piezoactuator described above is the fact that there can be an incorrect alignment of the connection pins for the electrical contacting of the piezoactuator.

The underlying object of the invention is therefore to improve the known reception bush described above to the extent that incorrect alignments of the connection pins for the electrical contacting of the piezoactuator on assembly are prevented.

This object is achieved, by a reception bush for a piezoactuator with two connection pins for electrical contacting of the piezoactuator, especially for a piezoactuator for driving an injector of an injection system for an internal combustion engine, with a first bush element and a second bush element, with the first bush element being connected in the assembled state to the second bush element, while through holes are arranged in the first bush element for the two connection pins of the piezoactuator, wherein at least one guide for the two connection pins is arranged in the second bush element.

The invention is based on the technical knowledge that the incorrect alignment of the electrical connection pins on assembly of the reception bush is caused by the fact that these are only fixed into the associated through holes on one side and can therefore tilt.

The invention therefore comprises the general technical teaching of providing a guide which fixes the connection pins for the electrical contacting of the piezoactuator during assembly and thereby prevents incorrect alignment. The through-holes for bringing the connection pins out of the reception bush are in this case preferably arranged in one element of the bush, whereas the additional guide provided for the two connection pins is preferably arranged in the other element of the bush, so that the connection pins are guided on both sides, which prevents incorrect alignment.

Preferably the guides for the two connection pins are formed into one of the two bush elements in one piece, with the guide preferably located inside on the lateral surface and on the end face of the bush.

In a preferred exemplary embodiment of the invention the guides are embodied for each of the two pins in a barrel shape, so that the ends of the connection pins are each held in a barrel-shaped guide.

Preferably the guides for the connection pins of the piezoactuator are each embodied as transverse supports and prevent a transverse movement of the guided ends of the connection pins. Since the connection pins are preferably also guided in the through-holes in the end face of the other bush element, this type of transverse support suppresses any swivel movement of the connection pins.

In addition the guides for the connection pins of the piezoactuator are preferably also embodied as axial supports and prevent an axial movement of the connection pins at least in an axial direction in relation to the axis of symmetry of the reception bush. Such an axial support of the two connection pins is advantageous to ensure that the two connection pins protrude for the same distance out of the reception bush.

Furthermore the guides for the connection pins of the piezoactuator are preferably also embodied as tipping moment supports and prevent a tipping movement of the connection pins In this way the assembly of the inventive reception bush is made significantly easier, since the connection pins, after insertion into the preferably barrel-shaped guides of the one bush element, are already correctly aligned, so that the other bush element can be easily put on, with the already previously correctly aligned connection pins pushing through the associated through-holes in the bush element to be put on.

The invention further comprises the general technical teaching of providing an anti-rotation device, so that the two bush elements of the reception bush retain a predetermined angular position relative to one another which allows assembly.

The advantage of such an anti-rotation device is that, when assembling the inventive reception bush there is no need to ensure that exact angular alignment of the two bush elements since this is ensured by the anti-rotation device.

In a preferred exemplary embodiment of the invention the anti-rotation device features a groove-spring connection, which consists of a groove formed in one of the two bush elements and a matching spring formed in the other bush element, which in the assembled state engages with the groove. The anti-rotation device can also feature a number of grooves and springs which are arranged distributed over the circumference of the bush sections and each engage with each other as a pair, to retain a predetermined angular position between the two bush elements.

Preferably the groove and/or the spring of this type of anti-rotation device features a taper which makes it easier to assemble the inventive reception bush, in that the introduction taper makes it possible to pre-assemble the two bush elements with an angular offset which is then compensated for during assembly by the insertion taper. The maximum permissible angular offset between the two bush sections can in this case lie in the range between 1° and 10°, which makes the assembly of the inventive reception bush significantly easier, since the requirements for angular alignment of the two bush elements are reduced.

In the assembled state of the inventive reception bush the individual bush elements are preferably connected to each other by a plug-in connection, with the plug-in connection having a connection length predetermined by the construction. The connection length in this case can be taken as the distance by which the two bush elements must be moved relative to each other to pass from a completely separated state into the assembled state. With a plug-in connection of this type it is advantageous if the insertion taper of the groove or spring in the axial direction of the bush elements only extends over a part of the plug-in connection length, whereas the remaining part of the plug-in connection length can be taken up by the anti-rotation device. Were the insertion tapers to extend over the entire plug-in connection length, the anti-rotation device would only work when the two bush elements are completely connected together. If the insertion taper on the other hand were only to extend over a fraction of the plug-in connection length, the angular offset initially occurring between the two bush elements in the pre-assembly would have to be compensated for by a very short plug-in length, which is mechanically disadvantageous. With the inventive reception bush the insertion taper therefore preferably extends over 10% to 50% of the entire plug-in connection length, which represents a good compromise between a secure effect of the anti-rotation device on the one hand and a good compensation of the angular offset between the bush elements to be assembled.

It should further be mentioned that the groove and/or the spring of the anti-rotation device preferably extend from the free end of the relevant bush element at least over a part of the plug-in connection length, so that the spring engages with the groove which the two bush elements are being pushed together and not only in the completely connected state.

In addition it is advantageous for the groove and/or the spring of the groove-spring connection to extend over the entire plug-in connection length of the plug-in connection, with the insertion taper only taking up a part of the plug-in connection length, whereas the anti-rotation device takes up the whole of the rest of the plug-in connection length. The groove-spring connection thus operates in this case on a part of the plug-in connection length as an anti-rotation device and on the other part of the plug-in connection length as an assembly aid to compensate for an angular offset between the bush elements to be assembled.

It is especially advantageous if, in the groove-spring connection, both the groove and also the spring feature an insertion taper so that the insertion tapers of groove and spring slide into each other as the pair so that an angular offset between the elements of the bush to be assembled are compensated for with slight mechanical loads. Preferably the insertion taper of the groove in this case essentially has the same insertion angle as the insertion taper of the spring, so that the two insertion tapers essentially slide on each planparallel and thereby with low friction.

The connection of the two bush elements is undertaken in the assembled state preferably by a conventional snap-on connection; however other press-fit or interference-fit connections between the bush elements to be assembled are also possible.

When a snap-on connection is used it is advantageous for the insertion taper to only operate up to the snap-on point when the two bush elements are put together, whereas after the snap-on point of the snap-on connection has been passed there is exclusively an anti-rotation effect. A possible angular offset between the bush elements to be assembled is thus compensated for in this case before the snap-on point of the snap-on connection is passed.

As regards the design of the insertion taper there are numerous options, however the insertion taper in the preferred exemplary embodiment is essentially straight and without bumps. It is however also possible within the framework of the invention for the insertion taper to have a curved shape with bumps.

In addition it should be mentioned that the insertion taper for the preferred exemplary embodiment has no set transition point in its transition into the anti-rotation device. For example the insertion taper can pass into the anti-rotation device with a kink but it is also possible however for the insertion device to pass into the anti-rotation device without any kink.

In the description of the prior art it has been already mentioned at the start that the two bush elements each feature cutouts in their end faces to guide the piezoactuator, which is preferably also the case with the inventive reception bush.

In the assembled state the piezoactuator extends through these cutouts from the inventive reception bush outwards, with the piezoactuator preferably forming a fit with the cutouts of which the angular play is greater and the angular play of the anti-rotation device in order to prevent the inventive reception push exercising rotation forces on the piezoactuator.

BRIEF DESCRIPTION OF THE DRAWINGS

Other advantageous developments of the invention are explained in more detail below together with the description of the preferred exemplary embodiment of the invention with reference to the figures. The figures show.

DETAILED DESCRIPTION

Figure 1:
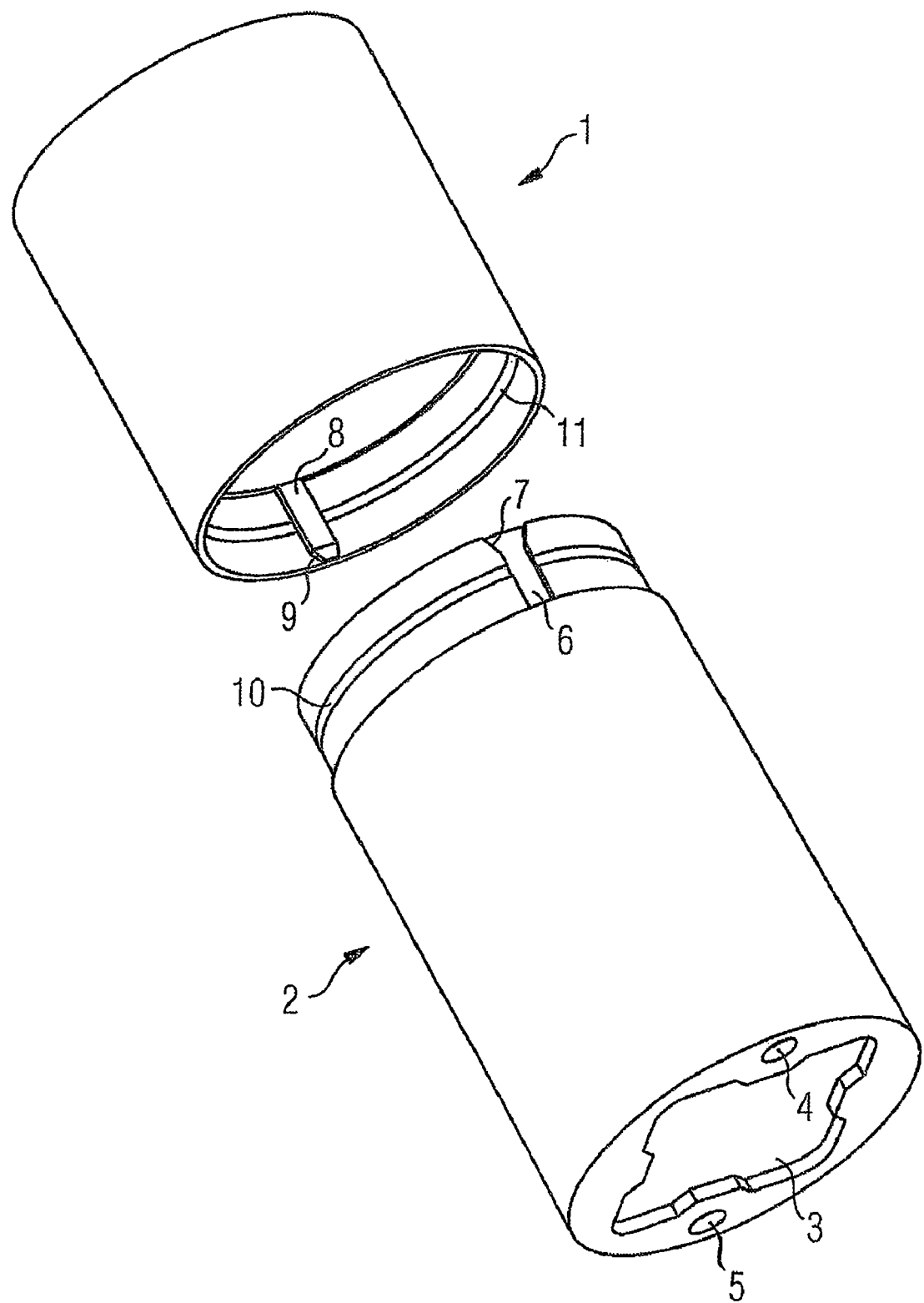
FIG. 1 a cross-sectional view of an inventive reception bush for a piezoactuator for driving an injector of an injection system for an internal combustion engine, as well as FIG. 2 another cross-sectional view of the reception bush from FIG. 1.

The reception bush shown in the drawings consists essentially of two cylindrical bush elements 1, 2, in the end faces of which a cutout 3 is arranged in each case for guiding the piezoactuator, in which case the cutout arranged in bush element 1 is hidden in the drawing.

In the addition in the end faces of the two bush elements 1,2 there are two circular holes 4, 5 which are arranged in the relevant end faces on opposite sides and a allow the connection pins of the piezoactuator to pass through them. The holes arranged in the bush element 1 are likewise hidden in this case.

On assembly of the reception bush the piezostack is first inserted into the bush element 2 until the piezostack protrudes out through the cutout 3, with the cutout 3 guiding the piezostack mechanically. The connection pins of the piezostack then extend outwards through the holes 4, 5 in the bush element 2 allowing electrical contacting of the piezostack.

Subsequently the bush element 1 is then put onto the bush element 2 so that the cutout 3 in the bush element 2 roughly covers the corresponding cutout in the end face of the bush element 1.

To make this assembly easier the outside lateral surface of the bush element 2 has two grooves running axially arranged on its end face on opposite sides with the width of the groove widening towards the free end of the bush element 2 in the direction towards the other bush element 1 in the form of an insertion taper 7.

In the inner lateral surface of the other bush element 1 two correspondingly matching springs 8 are arranged on opposite sides, of which the width reduces towards the free end of the bush element 1 in the direction of the other bush element 2 in the form of an insertion taper 9.

When the bush element 1 is put on to the bush element 2 no exact angular alignment of the two bush elements 1, 2 relative to one another is thus advantageously required, since an angular offset will be compensated for by the insertion tapers 7, 9.

The insertion tapers 7 of the grooves 6 in this case have the same insertion angle as the insertion tapers 9 of the springs 8, so that the insertion tapers 7, 9 slide on each other planparallel and thereby with low friction.

In the assembled state the two bush elements 1,2 are connected to each other by a snap-on connection which consists of a circular groove 10 in bush element 2 and a corresponding circular snap-on protrusion 11 in the internal lateral surface of the bush element 1.

It should also be mentioned that the insertion tapers 7,9 only extend over a part of about 30% of the plug-in connection length whereas the groove-slot connection between the groove 6 and the spring 8 on the remaining part of the plug-in a connection length is used exclusively for anti-rotation. In the way the anti-rotation device already operates once the snap-on point of the snap-on connection has been passed during assembly.

It should further be mentioned that the cutouts 3 in the end faces of the bush elements 1,2 form a guide with the piezostack of which the angular play is greater than the angular play of the anti-rotation facility formed by the groove-spring connection. This ensures that the bush elements 1, 2 in the assembled state do not exert any rotational force on the piezostack.

Figure 2:
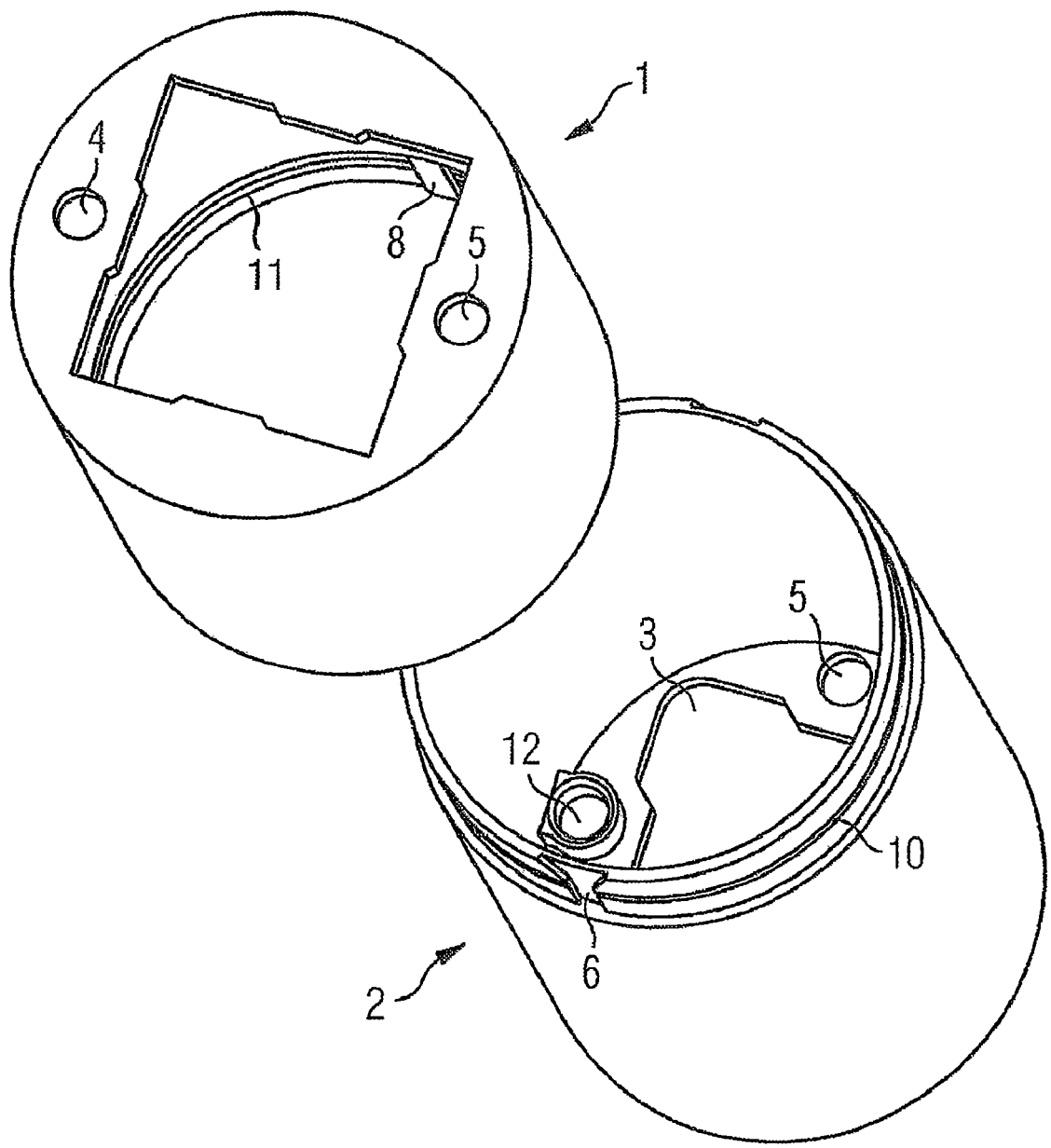

Finally FIG. 2 also shows that on the internal side of the bush element 2 on the end face and the lateral surface adjoining opposite sides of the bush element 2 there are two barrel-shaped guides 12 formed in one piece, which on assembly of the inventive reception bush guide the connection pins for electrical contacting of the piezoactuator and thereby prevent an incorrect alignment of the connection pins during assembly.

The connection pins are inserted for this purpose on assembly into the barrel-shaped guides 12 and then on insertion of the other bush element 1 protrude through the holes 4, 5.

After the reception bush is filled with a sealant (e.g. Silicon) the two connection pins and the piezoceramic stack are then fixed in any event so that their correct alignment remains ensured.

The invention is not limited to the preferred exemplary embodiments described in this document. Instead a plurality of variants and derivatives are possible which also make use of the inventive idea and therefore fall into the protected area.

What is claimed is:

1. A reception bush for a piezoactuator with two connection pins for electrical contacting of the piezoactuator, especially for a piezoactuator for driving an injector of an injection system for an internal combustion engine, comprising:
    a first bush element and a second bush element,
    wherein the first bush element is connected in the assembled state to the second bush element,
    through holes arranged in the first bush element for the two connection pins of the piezoactuator,
    at least one guide for the two connection pins arranged in the second bush element, and
    an anti-rotation device including a first structure of the first bush element configured to interact with a second structure of the second bush element to retain a predetermined angular position between the first bush element and the second bush element, regardless of whether the piezoactuator is present in the reception bush.

2. A reception bush in accordance with claim 1, wherein the guides for the two connection pins are formed in one piece on the second bush element.

3. A reception bush in accordance with claim 1, wherein the guides for the two connection pins are formed in one piece inside on the lateral surface of the second bush.

4. A reception bush in accordance with claim 1, wherein the guides for each of the two connection pins are embodied in a barrel shape in each case.

5. A reception bush in accordance with claim 1, wherein the guides for the connection pins of the piezoactuator are embodied as transverse supports in each case and prevent a transverse movement of the guided ends of the connection pins.

6. A reception bush in accordance with claim 1, wherein the guides for the connection pins of the piezoactuator are embodied as an axial support and prevent an axial movement of the connection pins at least in an axial direction.

7. A reception bush in accordance with claim 1, wherein the guides for the connection pins of the piezoactuator are embodied as tipping moment supports and prevent a tipping movement of the connection pins.

8. A reception bush in accordance with claim 1, wherein the anti-rotation device features a groove-spring connection, consisting of a groove made in one of the two bush elements and a matching spring formed in the other bush element, which engages with the groove in the assembled state.

9. A reception bush in accordance with claim 8, wherein at least one of the groove and the spring features an insertion taper, with the insertion taper allowing pre-assembly of the first bush element and of the second bush element with an angular offset.

10. A reception bush in accordance with claim 9, wherein the maximum angular offset for pre-assembly lies in the range of between 1° and 10°.

11. A reception bush in accordance with claim 9, comprising a plug-in connection between the first bush element and the second bush element with a predetermined plug-in connection length, with the insertion taper only extending in the axial direction over a part of the plug-in connection length.

12. A reception bush in accordance with claim 11, wherein the insertion taper extends in the axial direction over 10% to 50% of the plug-in connection length.

13. A reception bush in accordance with claim 11, wherein the groove and/or the spring extends, starting from the free end of the relevant bush element in each case at least over a part of the plug-in connection length, so that the spring engages even during of the putting together of the two bush elements into the groove.

14. A reception bush in accordance with claim 11, wherein the groove and/or the spring of the groove-spring connection extends over the entire length of the plug-in connection, with the insertion taper taking up a part of the plug-in connection length, whereas the anti-rotation device takes up the entire remainder of the plug-in connection length.

15. A reception bush in accordance with claim 9, wherein the groove and also the spring features an insertion taper.

16. A reception bush in accordance with claim 15, wherein the insertion taper of the groove has essentially the same insertion angle as the insertion angle of the spring, so that the two insertion angles essentially slide planparallel on each other during assembly.

17. A reception bush for a piezoactuator with two connection pins for electrical contacting of the piezoactuator, especially for a piezoactuator for driving an injector of an injection system for an internal combustion engine, comprising:
 a first bush element and a second bush element,
 wherein the first bush element is connected in the assembled state to the second bush element,
 through holes arranged in the first bush element for the two connection pins of the piezoactuator, and
 at least one guide for the two connection pins arranged in the second bush element,
 wherein the first bush element in the assembled state is connected to the second bush element by a snap-on connection which features a predetermined snap-on point.

18. A reception bush in accordance with claim 17, further comprising an insertion taper that only operates up to a maximum of the first snap-on point when the two bush elements are put together.

19. A reception bush in accordance with claim 9, wherein the tapers run essentially straight and without bumps.

20. A reception bush in accordance with claim 19, wherein the tapers pass into the anti-rotation device without any transition.

21. A reception bush in accordance with claim 9, wherein there is a kink at the transition point between the insertion tapers and the anti-rotation device.

22. A reception bush in accordance with claim 1, wherein the first bush element and the second bush element each feature cutouts in their end faces for guiding the piezoactuator.

23. A reception bush in accordance with claim 22, wherein the piezoactuator with the cutouts forms a fit of which the angular play is greater than the angular play of the anti-rotation device, to prevent rotation forces on the piezoactuator.

* * * * *